United States Patent
Baudot et al.

(10) Patent No.: US 11,500,157 B1
(45) Date of Patent: Nov. 15, 2022

(54) SILICON SELECTIVE EPITAXIAL GROWTH (SEG) APPLIED TO A SILICON ON INSULATOR (SOI) WAFER TO PROVIDE A REGION OF CUSTOMIZED THICKNESS

(71) Applicant: Ciena Corporation, Hanover, MD (US)

(72) Inventors: Charles Baudot, Québec (CA); Alexandre Delisle-Simard, Québec (CA); Michel Poulin, Québec (CA)

(73) Assignee: Ciena Corporation, Hanover, MD (US)

( * ) Notice: Subject to any disclaimer, the term of this patent is extended or adjusted under 35 U.S.C. 154(b) by 349 days.

(21) Appl. No.: 16/824,313

(22) Filed: Mar. 19, 2020

Related U.S. Application Data

(60) Provisional application No. 62/822,422, filed on Mar. 22, 2019.

(51) Int. Cl.
| | |
|---|---|
| *G02B 6/13* | (2006.01) |
| *H01L 21/20* | (2006.01) |
| *G02F 1/025* | (2006.01) |
| *G02B 6/12* | (2006.01) |

(52) U.S. Cl.
CPC .......... *G02B 6/131* (2013.01); *H01L 21/2018* (2013.01); *G02B 2006/12178* (2013.01); *G02F 1/025* (2013.01); *G02F 2201/302* (2013.01)

(58) Field of Classification Search
CPC .......... G02B 6/131; G02B 2006/12178; H01L 21/2018
See application file for complete search history.

(56) References Cited

U.S. PATENT DOCUMENTS

| | | | |
|---|---|---|---|
| 5,952,695 A | * | 9/1999 | Ellis-Monaghan ......... H01L 27/0251 257/349 |
| 7,352,931 B1 | | 4/2008 | Painchaud et al. |
| 7,422,956 B2 | * | 9/2008 | Waite ............... H01L 21/76254 438/455 |
| 9,269,570 B2 | | 2/2016 | Morand et al. |
| 9,354,396 B2 | | 5/2016 | Baudot |
| 9,461,441 B2 | | 10/2016 | Chantre et al. |
| 9,823,419 B1 | | 11/2017 | Pelletier et al. |
| 9,841,618 B1 | | 12/2017 | Poulin et al. |
| 9,891,450 B2 | | 2/2018 | Baudot et al. |
| 10,042,115 B2 | | 8/2018 | Boeuf et al. |
| 10,073,219 B2 | | 9/2018 | Baudot |
| 10,101,528 B2 | | 10/2018 | Guerber et al. |
| 10,126,497 B2 | | 11/2018 | Boeuf et al. |
| 10,274,395 B2 | | 4/2019 | Carpentier et al. |

(Continued)

FOREIGN PATENT DOCUMENTS

WO  2019148011 A1  8/2019

*Primary Examiner* — Michael Stahl
(74) *Attorney, Agent, or Firm* — Clements Bernard Baratta; Lawrence A. Baratta, Jr.; Christopher L. Bernard

(57) ABSTRACT

A method of Silicon Selective Epitaxial Growth (SEG) applied to a Silicon on Insulator (SOI) wafer to provide a first region of customized thickness includes with the SOI wafer having a standard thickness, applying a hard mask to a plurality of regions of the SOI wafer including the first region; applying photo-lithography protection to cover the hard mask in all of the plurality of regions except the first region; removing the hard mask in the first region; and performing Silicon SEG in the first region to provide the customized thickness in the first region, wherein the customized thickness is greater than the standard thickness.

18 Claims, 16 Drawing Sheets

(56) References Cited

U.S. PATENT DOCUMENTS

| | | | |
|---|---|---|---|
| 10,288,806 B2 | 5/2019 | Baudot | |
| 2008/0099425 A1* | 5/2008 | Jordana | G02B 6/1223 |
| | | | 216/2 |
| 2012/0189239 A1* | 7/2012 | Tu | G02F 1/025 |
| | | | 385/2 |
| 2014/0363120 A1* | 12/2014 | Stephens | G02B 6/125 |
| | | | 385/14 |
| 2015/0054055 A1* | 2/2015 | Chen | H01L 21/32 |
| | | | 438/694 |
| 2015/0247974 A1 | 9/2015 | Painchaud et al. | |
| 2016/0299363 A1* | 10/2016 | Wei | H01L 21/30604 |
| 2017/0192170 A1 | 7/2017 | Baudot et al. | |
| 2019/0187375 A1 | 6/2019 | Nemouchi et al. | |
| 2019/0280144 A1 | 9/2019 | Baudot et al. | |
| 2019/0280146 A1 | 9/2019 | Baudot et al. | |
| 2019/0285802 A1 | 9/2019 | Guerber et al. | |
| 2019/0391006 A1 | 12/2019 | Pelletier et al. | |
| 2020/0064707 A1 | 2/2020 | Vitic et al. | |
| 2020/0073153 A1 | 3/2020 | Baudot | |
| 2020/0073154 A1* | 3/2020 | Simard | G02F 1/025 |
| 2020/0133091 A1* | 4/2020 | Oh | G02B 6/1347 |
| 2022/0043203 A1* | 2/2022 | Reed | G02B 6/122 |

\* cited by examiner

SILICON SELECTIVE EPITAXIAL GROWTH (SEG) APPLIED TO A SILICON ON INSULATOR (SOI) WAFER TO PROVIDE A REGION OF CUSTOMIZED THICKNESS

FIELD OF THE DISCLOSURE

The present disclosure generally relates to Silicon (Si) photonics fabrication. More particularly, the present disclosure relates to systems and methods for Si Selective Epitaxial Growth (SEG) applied to a Silicon on Insulator (SOI) wafer to locally provide a customized device, with a customized thickness different from the remainder of the SOI wafer.

BACKGROUND OF THE DISCLOSURE

Optical networking and the like are moving towards the use of Silicon Photonics (SiP), where components are manufactured/fabricated on silicon, namely Silicon on Insulator (SOI) wafers. Various optical components associated with optical networking and the like can be fabricated on such SOI wafers, including, without limitation, modulators, demodulators, lasers, photodetectors, and the like. Typically, SOI wafers have a set thickness, i.e., common and standard SOI wafer thicknesses. There is a need for a customized SOI thickness for some devices, but a standard SOI thickness for the remaining devices. For example, a standard SOI thickness of a Si layer includes 220 nm. Thicker SOI wafers can be used, but the whole SOI platform is changed. For example, existing devices in a fabrication library can be used with a thicker SOI wafer, but there is a requirement for etching down to the standard thickness, and this would lead to variability. Additionally, silicon photonics is constrained by the availability of SOI wafer vendors, which is not significant.

BRIEF SUMMARY OF THE DISCLOSURE

The present disclosure relates to systems and methods for Si Selective Epitaxial Growth (SEG) applied to a Silicon on Insulator (SOI) wafer to locally provide a customized device, with a customized thickness different from the remainder of the SOI wafer. Generally, the present disclosure includes aspects to provide customized thickness on an SOI wafer starting with a standard thickness throughout of the Si layer, e.g., 220 nm. Traditionally, SEG is used in silicon photonics for germanium (Ge) epitaxy for photodetectors. However, SEG is proposed herein to customize the thickness of a Si junction device, such as a modulator, i.e., a PN junction, locally on an SOI wafer using an auto-aligned method. The present disclosure includes applying a Si SEG on top of a dedicated waveguide to fabricate a customized PN-junction. The SEG is performed using a hard mask replacement strategy to provide auto-alignment. Advantageously, using SEG for the specific device, the remaining platform is left unaltered. The process is performed using common and standard SOI wafer thicknesses, such as 220 nm, although other values are contemplated. The process is auto-aligned; no additional lithography is needed. The process adds a level of control and tuning of the device thickness during material growth. In an embodiment, a thicker hard mask layer of 200 nm or more is deposited as a hard mask. In another embodiment, a multilayer can be used with typical hard mask materials that are adapted for this integration, including silicon nitride (SiN), aluminum nitride (AlN), silicon oxynitride (SiON), titanium nitride (TiN), and the like.

In an embodiment, a method of Silicon Selective Epitaxial Growth (SEG) applied to a Silicon on Insulator (SOI) wafer to provide a first region of customized thickness includes, with the SOI wafer having a standard thickness, applying a hard mask to a plurality of regions of the SOI wafer including the first region; applying photo-lithography protection to cover the hard mask in all of the plurality of regions except the first region; removing the hard mask in the first region; and performing Silicon SEG in the first region to provide the customized thickness in the first region, wherein the customized thickness is greater than the standard thickness. The method can include performing implantation in the first region to form a PN junction. The first region can include a modulator. The performing implantation can be performed either before applying the hard mask or after the performing Silicon SEG.

The method can include performing patterning, photo-lithography protection, and/or etching in any of the plurality of regions excluding the first region, subsequent to the applying the hard mask. The method can include performing gap-fill deposition over the SOI wafer to fill in any etched regions, prior to the applying photo-lithography protection. A material for the gap-fill can be different from a material for the hard mask. A material for the hard mask can include any of SiN, AlN, SiON, and TiN. The hard mask can include a thickness similar to a thickness of the SOI wafer.

In another embodiment, a Silicon on Insulator (SOI) wafer is described having a first region of customized thickness. The SOI wafer is formed by a process including the steps of, with the SOI wafer having a standard thickness, applying a hard mask to a plurality of regions of the SOI wafer including the first region; applying photo-lithography protection to cover the hard mask in all of the plurality of regions except the first region; removing the hard mask in the first region; and performing Silicon SEG in the first region to provide the customized thickness in the first region, wherein the customized thickness is greater than the standard thickness.

The process further includes the steps of performing implantation in the first region to form a PN junction. The first region can include a modulator. The performing implantation can be performed either before the applying the hard mask or after the performing Silicon SEG. The process can further include the steps of performing patterning, photo-lithography protection, and/or etching in any of the plurality of regions excluding the first region, subsequent to the applying the hard mask.

The process can further include the steps of performing gap-fill deposition over the SOI wafer to fill in any etched regions, prior to the applying photo-lithography protection. A material for the gap-fill can be different from a material for the hard mask. A material for the hard mask can include any of SiN, AlN, SiON, and TiN. The hard mask can include a thickness similar to a thickness of the SOI wafer.

In a further embodiment, a modulator is described formed on a standard thickness Silicon on Insulator (SOI) wafer formed by a process including the steps of, with the SOI wafer having a standard thickness, applying a hard mask to a plurality of regions of the SOI wafer including a first region where the modulator will be located; applying photo-lithography protection to cover the hard mask in all of the plurality of regions except the first region; removing the hard mask in the first region; performing Silicon SEG in the first region to provide the customized thickness in the first region, wherein the customized thickness is greater than the standard thickness; and performing implantation in the first region to form a PN junction. The process can further include the steps of performing patterning, photo-lithography protection, and/or etching in any of the plurality of regions excluding the first region, subsequent to the applying the hard mask.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
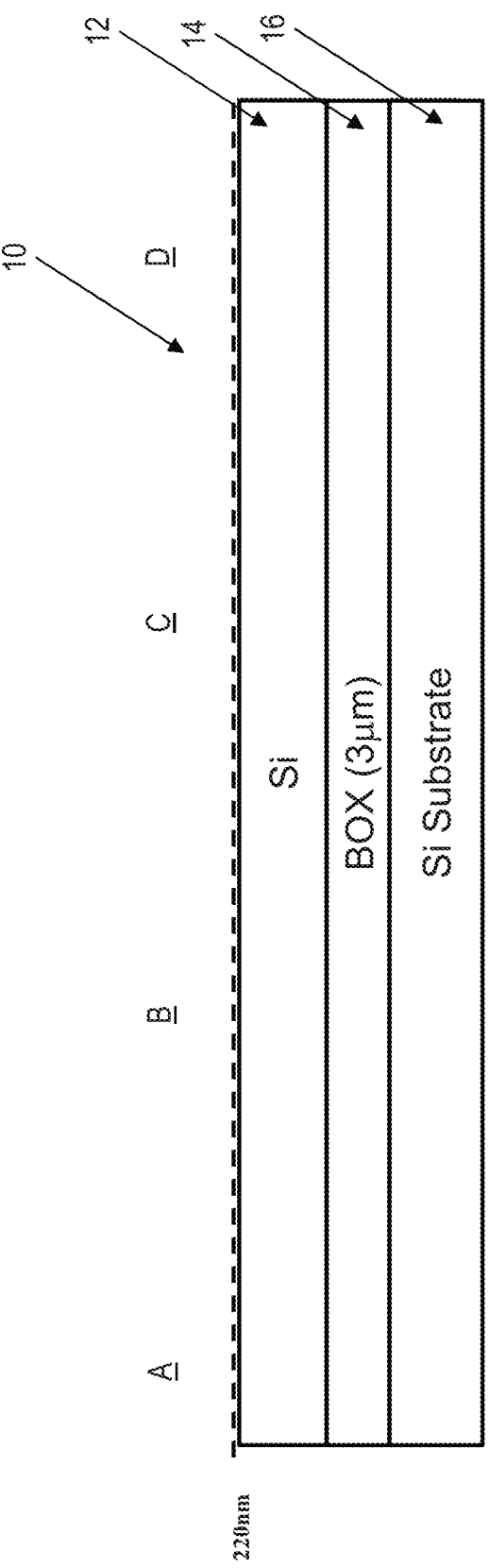
FIGS. 1-14 are diagrams illustrating a fabrication process of a Silicon on Insulator (SOI) wafer having a standard thickness to fabricate a region having a customized thickness.

Again, the present disclosure relates to systems and methods for Si Selective Epitaxial Growth (SEG) applied to a Silicon on Insulator (SOI) wafer to locally provide a customized device, with a customized thickness different from the remainder of the SOI wafer. Generally, the present disclosure includes aspects to provide customized thickness on an SOI wafer starting with a standard thickness throughout of the Si layer, e.g., 220 nm. In an embodiment, the present disclosure is utilized to fabricate a customized device, including a PN-junction having an SOI thickness that is larger than a standard SOI wafer thickness. The customized device can be a modulator that exploits the Transverse Magnetic (TM) mode (vertical polarization) of a PN-junction so that the mode confinement is optimized while still preserving suitable electrical addressing. An example of such a device is described in U.S. patent application Ser. No. 16/554,736, filed Aug. 29, 2019, and entitled "Silicon photonics modulator using TM mode and with a modified rib geometry," the contents of which are incorporated by reference herein in its entirety. For example, the standard SOI wafer thickness can be about 220 nm of the Si layer, and the customized thickness can be greater than or equal to about 400 nm.

Traditionally, SEG is used in silicon photonics for germanium (Ge) epitaxy for photodetectors. However, SEG is proposed herein to customize the thickness of a Si junction device locally on an SOI wafer using an auto-aligned method. The present disclosure includes applying a Si SEG on top of a dedicated waveguide to fabricate a customized PN-junction. The SEG is performed using a hard mask replacement strategy to provide auto-alignment. Advantageously, using SEG for the specific device, the remaining platform is left unaltered. The process is performed using common and standard SOI wafer thicknesses of the Si layer, such as 220 nm, although other values are contemplated. The process is auto-aligned; no additional lithography is needed. The process adds a level of control and tuning of the device thickness during material growth.

In an embodiment, a thicker hard mask layer of 200 nm or more is deposited as a hard mask. The hard mask can include various materials such as silicon nitride (SiN), aluminum nitride (AlN), silicon oxynitride (SiON), titanium nitride (TiN), and the like. Also, to obtain the desired thickness, a multilayer hard mark can be used with typical hard mask materials that are adapted for this integration.

FIGS. 1-14 are diagrams illustrating a fabrication process of an SOI wafer 10 having a standard thickness to fabricate a region having a customized thickness. As described herein, the fabrication process can be used to form a PN-junction having customized SOI thickness for a modulator. The proposed fabrication process includes using an SEG of silicon to have a localized thicker SOI only for the region while not changing the other aspects of the platform. FIGS. 1-14 are side views of the various layers of the SOI wafer 10.

The description related to FIGS. 1-14 provides an example illustration of the fabrication process, which involves creating a grating coupler 80, a strip waveguide 82, a Modulator (MOD) 84, and a slab section for the fabrication of a photodetector (PD) 86 on the SOI wafer 10. Of course, other embodiments are contemplated with FIGS. 1-14 presented for illustration purposes. The SOI wafer 10 includes regions A, B, C, D on top of the Si layer 12. In this example, the grating coupler 80, the strip waveguide 82, the modulator 84, and the photodetector 86 are formed in the regions A, B, C, D, respectively. Note, each of FIGS. 1-14 shows a progression of the fabrication process 10 from FIG. 1, where an SOI wafer 10 with a standard thickness is obtained to FIG. 14, where the final device is achieved.

In this example, the modulator 84 requires the region C of customized thickness, i.e., greater than the standard thickness of the SOI wafer 10. The fabrication process includes SEG growth at the modulator 84. Also, some of the steps in the fabrication process include existing SiP processes, which are described in conjunction with the additional steps in the fabrication process for the growth of the region C of customized thickness.

As described herein, the term standard thickness means a value where vendors provide SOI wafers and where there are processes developed for such thicknesses. Also, the terms thickness and depth may be used interchangeably herein. Again, 220 nm is an example standard thickness of the Si layer, and there are various SiP processes where components are manufactured/fabricated on silicon at this thickness. Of course, other values besides 220 nm are contemplated. Again, as described herein, one approach to a customized thickness would be to obtain an SOI wafer that has a thickness overall that is equal to the larger, customized thickness. However, this approach would require new SiP processes for those components not designed to operate on such a larger thickness Si layer, and would lead to variability due to inherent partial etch non-uniformity of those processes. The present disclosure takes the approach that the customized thickness is grown only where needed on a standard thickness SOI wafer 10.

In FIG. 1, an SOI wafer 10 is obtained from an SOI wafer supplier. As described herein, the SOI wafer can have a "standard" thickness of about 220 nm of Si. The SOI wafer 10 can also include a Si layer 12, a Buried Oxide (BOX) layer 14, and a Si substrate layer 16. Those of ordinary skill in the art will recognize the sizes of the layers 12, 14, 16 in FIGS. 1-14 are not drawn to scale. The Si layer 12 in the top portion of the SOI wafer 10 is the active layer where fabrication is performed. Note, the SOI wafer 10 is shown as an example, and other types of SOI wafers are also contemplated, e.g., with different middle layers, with different thicknesses, with different resistivities, etc. Again, in the example of FIG. 1, the modulator 84 requires a region of customized thickness greater than 220 nm, e.g., 400 nm.

Figure 2:
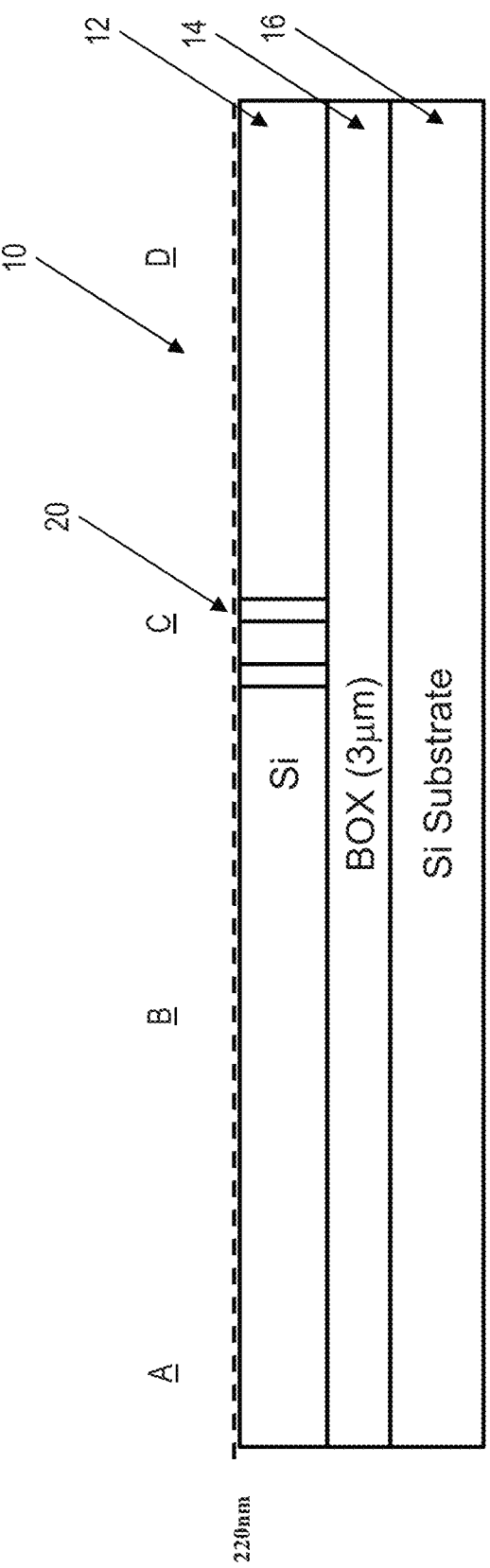

In FIG. 2, the SOI wafer 10 is patterned, and implantation is performed for a PN-junction 20, at the modulator 86. Of course, the process illustrated here relates to the fabrication of a PN-junction for a modulator but, it can be applied to any other device bearing different implantation schemes. Note, the implantation is optional at this stage—the implantation can be performed later in the fabrication process. In a specific embodiment, the PN-junction 20 can use Boron for compensating the dopant on the modulator n-side, and the PN-junction 20 can use Phosphorus and serves at compensating the dopant on the modulator p-side. More generally, implantation can be done before, after or not all with respect to the SEG process.

Figure 3:
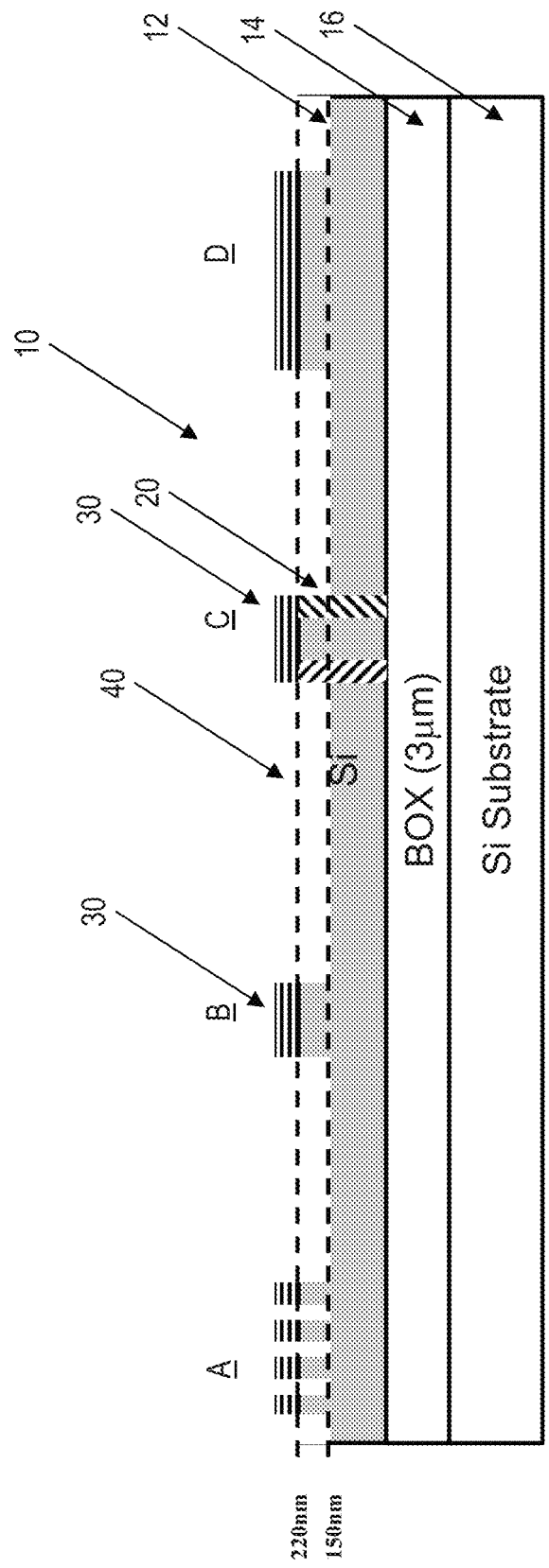

In FIG. 3, there is a hard mask 30 deposition, and a hard mask patterning and etching to remove portions 40 from the Si layer 12 of the SOI wafer 10. The hard mask 30 can include thick SiN or a multi-layer approach with SiN, poly-Si/SiN, etc. In an embodiment, a thicker hard mask layer of 200 nm or more is deposited as a hard mask. Example materials for the hard mask can include SiN, AlN, SiON, TiN, and the like. In another embodiment, a multi-layer can be used with typical hard mask materials that are adapted for this integration.

The hard mask patterning and etching are performed to isolate/fabricate various devices in the regions A, B, C, D, including the PN-junction 20 in region C. The hard mask patterning can include Photo Resist (PR) coating, exposure, and development. The etching can be a partial etch to form rib waveguides.

Figure 4:
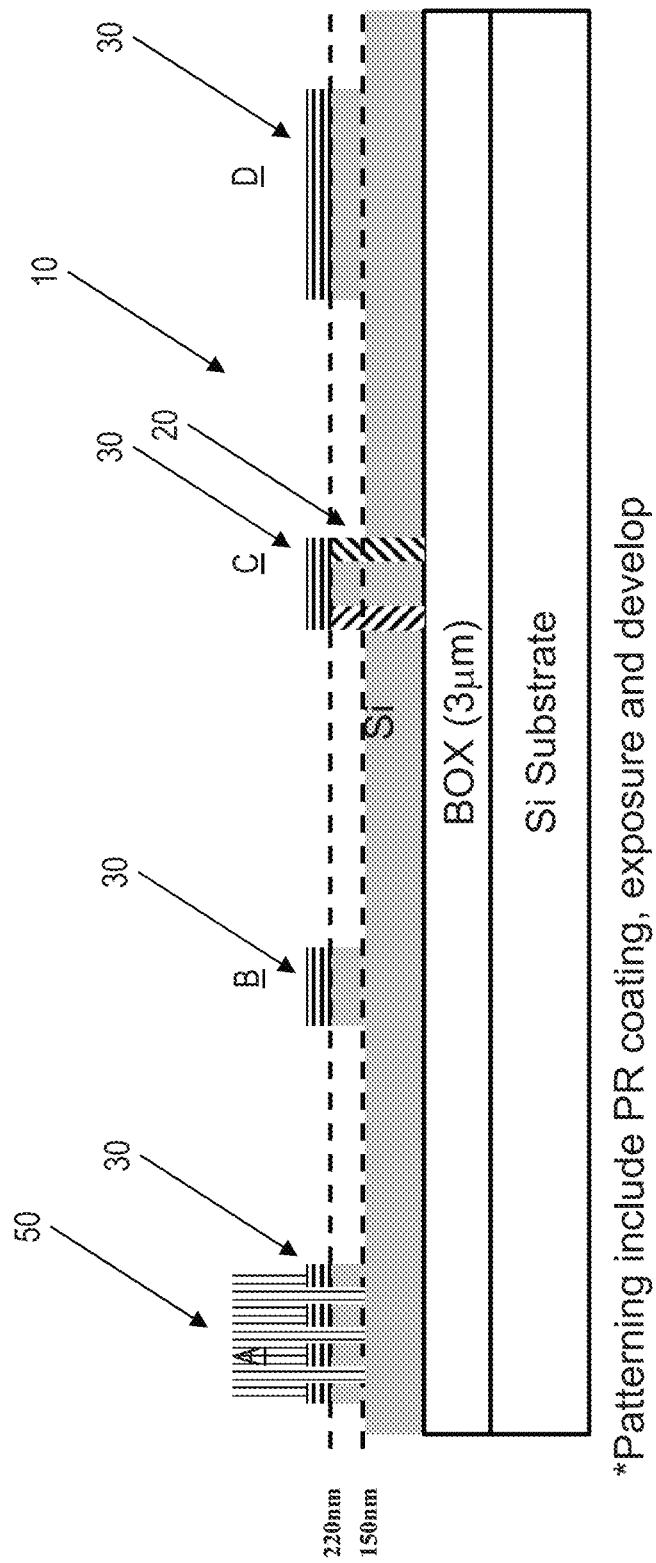
Figure 5:
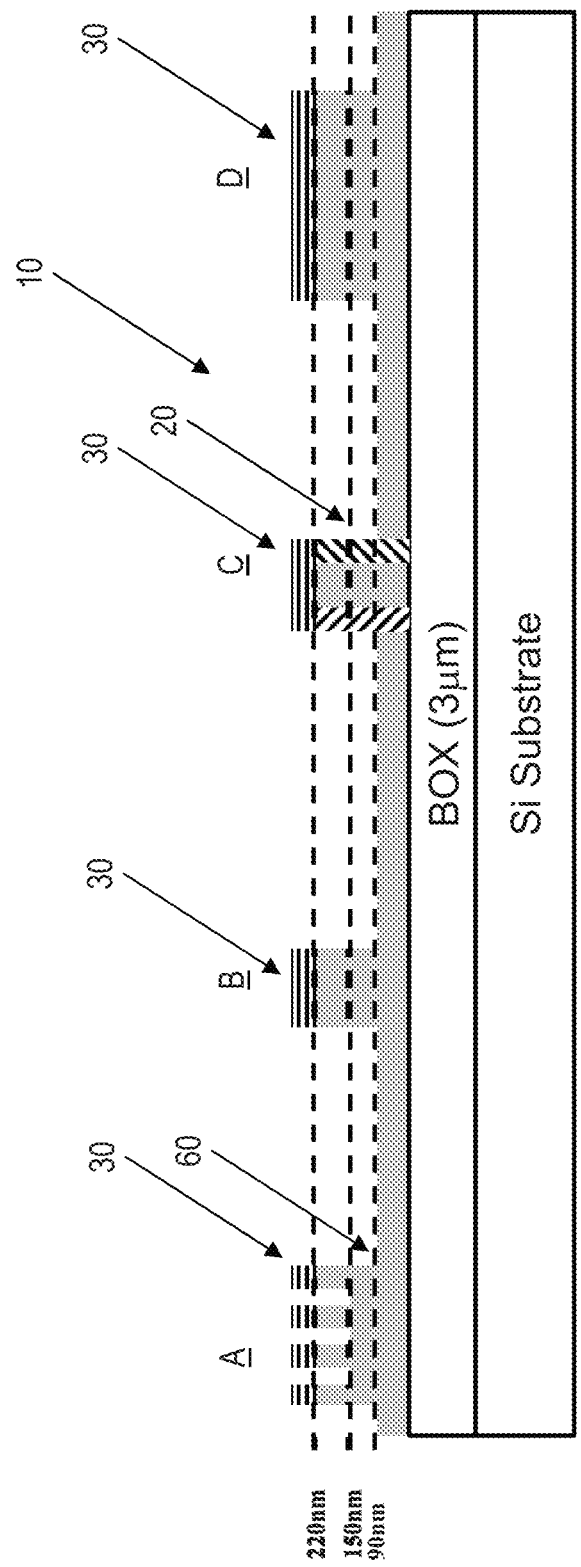

In FIG. 4, photo-lithography shallow etch protection 50 is provided in the region A, to protect the grating coupler 80 before additional etching in FIG. 5. The protection 50 can be a photoresist.

In FIG. 5, there is a grating coupler patterning 60 that can include an additional Si partial etch, and the photo-lithography shallow etch protection 50 prevents the removal of this additional Si material in the region A.

Figure 6:
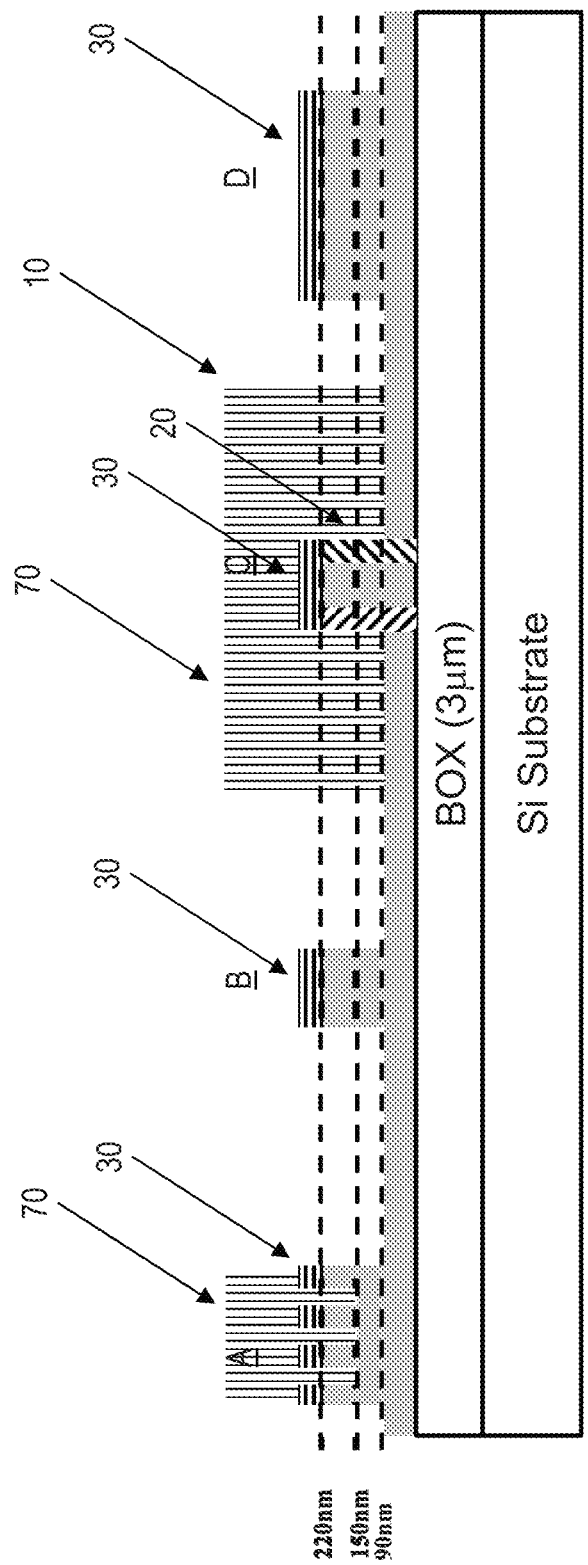

In FIG. 6, photo-lithography partial etch protection 70 is provided in the regions A, C. The protection 70 can be a photoresist.

Figure 7:
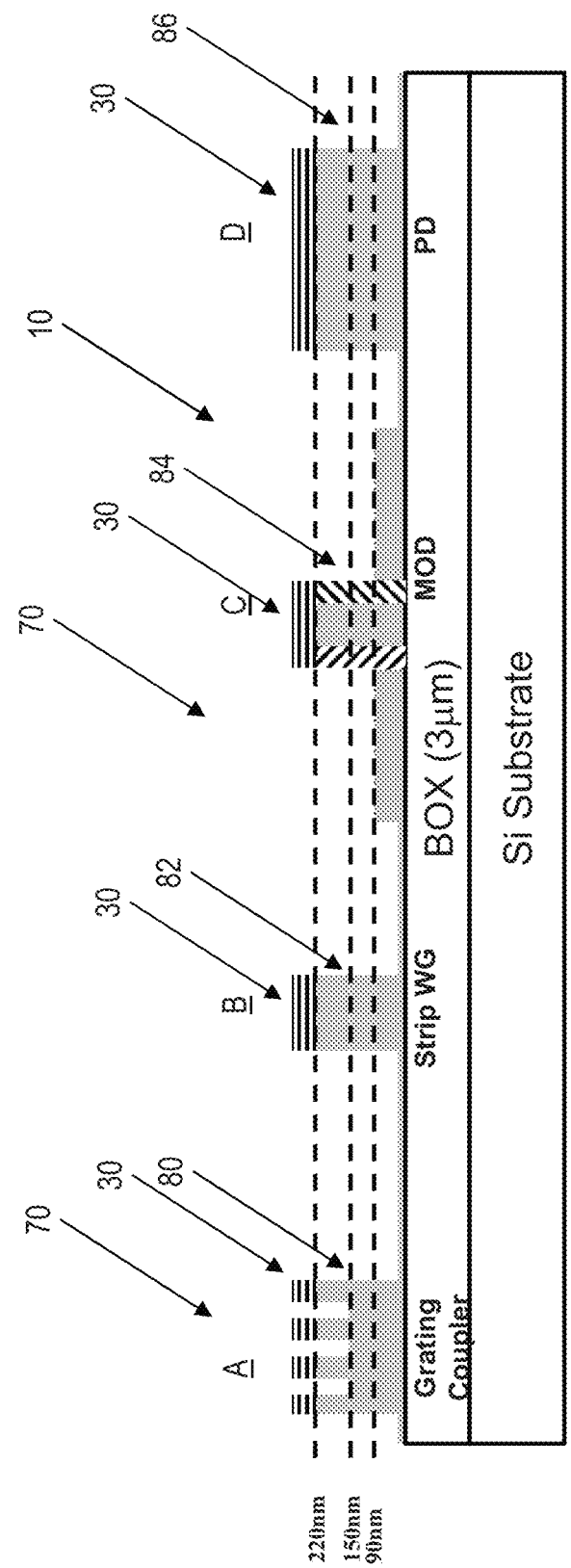

In FIG. 7, Si slab patterning, and Si slab full etching are performed to remove select Si material in the Si layer 12 up to the BOX layer 14. The protection 70 from FIG. 6 protects the regions A, C from the removal in this stage At this stage, for example, the SOI wafer 10 has four devices, namely the grating coupler 80, the strip waveguide 82, the modulator 84, and the photodetector 86, in the regions A, B, C, D, respectively.

Figure 8:
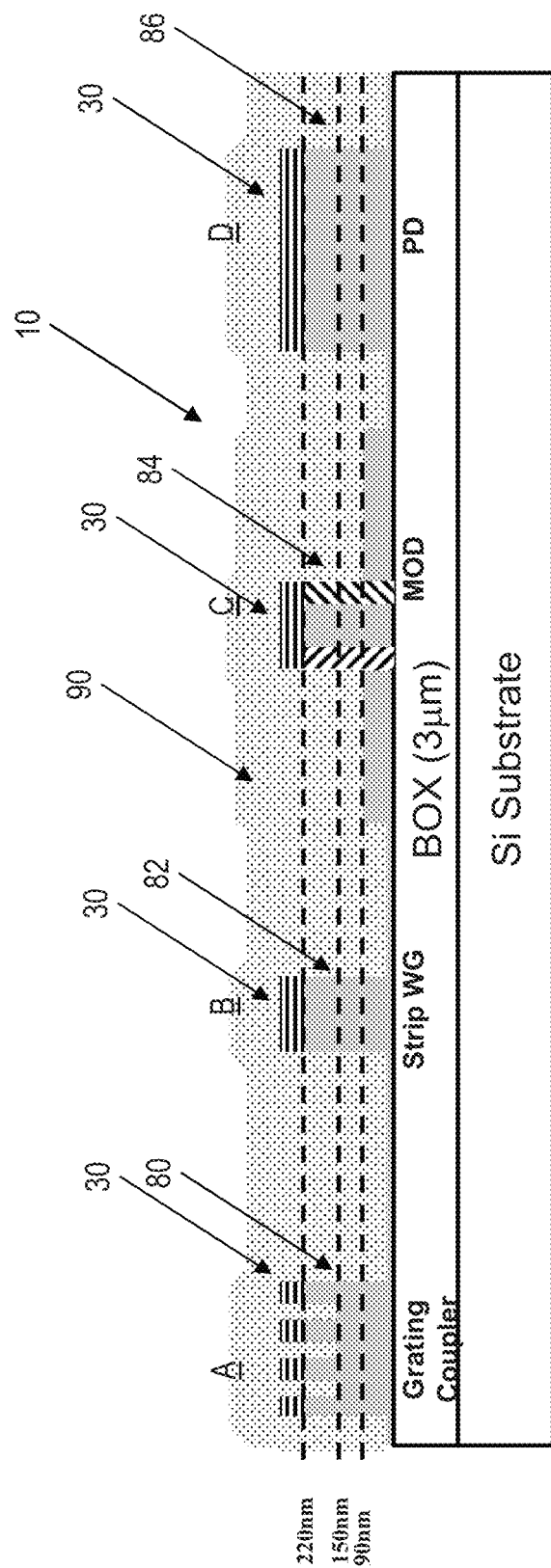

In FIG. 8, a gap-fill 90 deposition is provided, such as Silicon dioxide ($SiO_2$). Note, the choice of the gap fill 90 material affects the choice of the hard mask 30 material. Namely, the gap-fill 90 and the hard mask 30 should be different materials. Here, if the gap fill 90 is $SiO_2$, then the hard mask 30 should be a material other than $SiO_2$.

Figure 9:
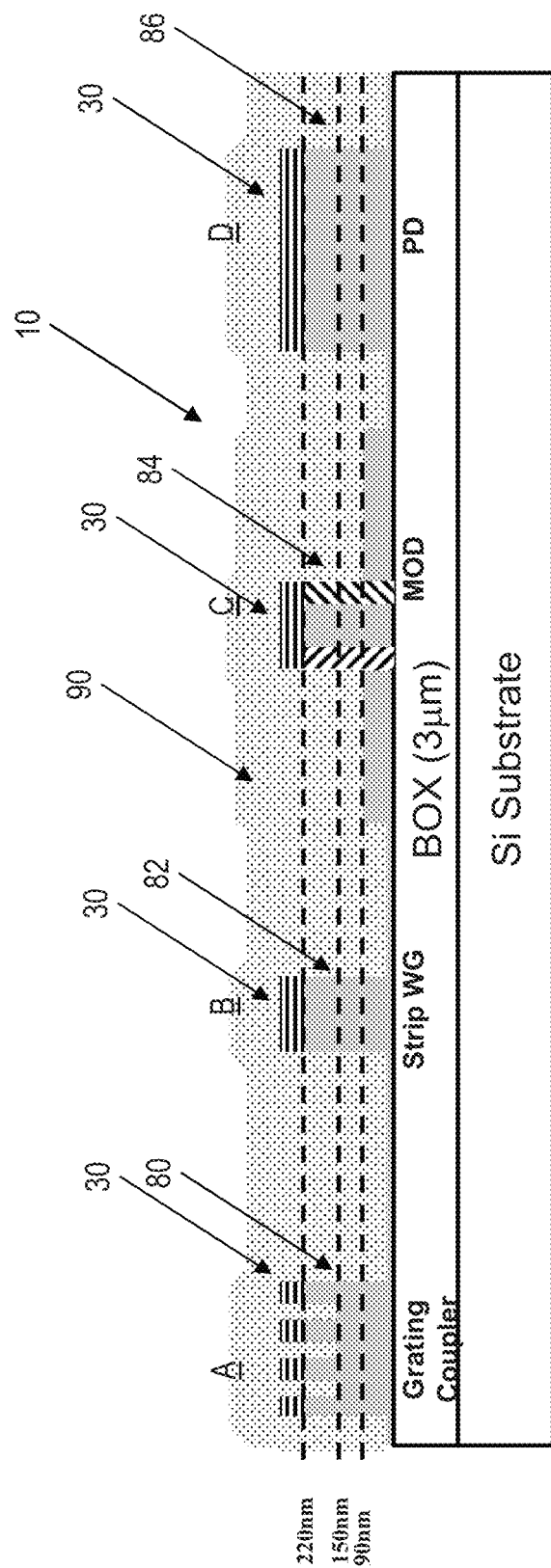

In FIG. 9, the gap-fill 90 is cured through an annealing process for densification purposes.

Figure 10:
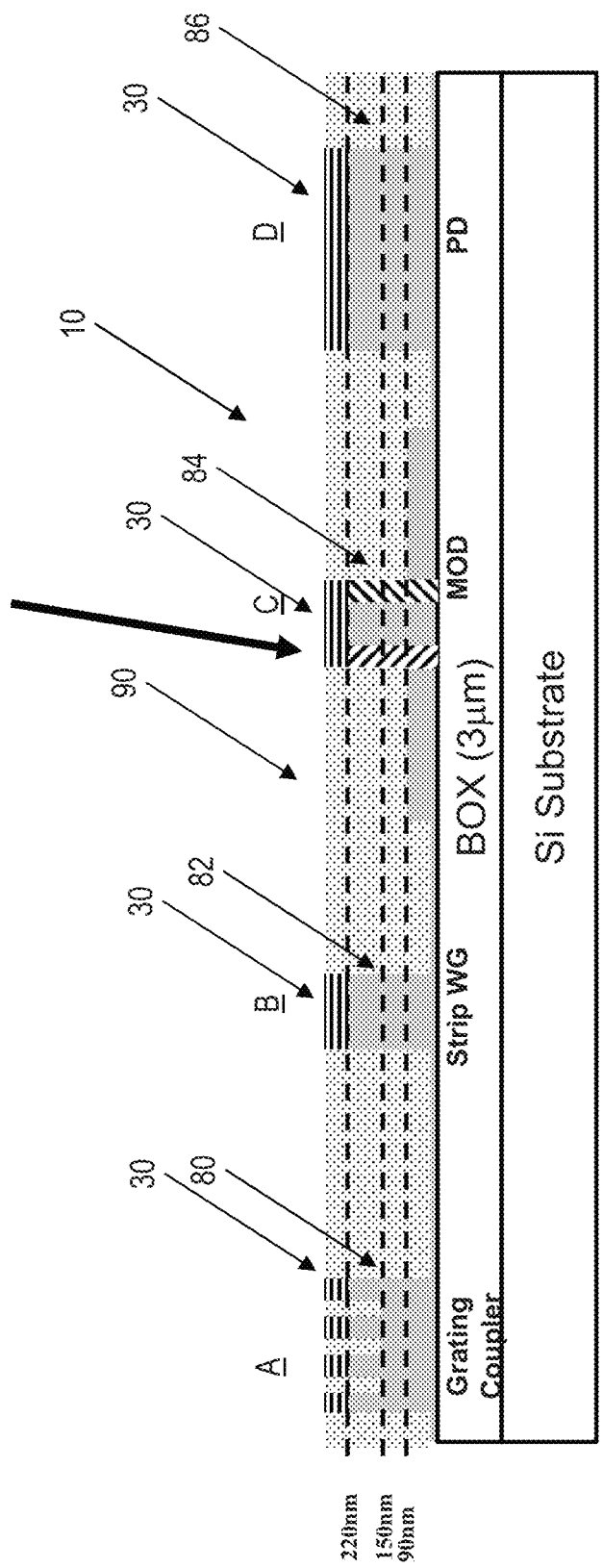

In FIG. 10, Chemical Mechanical Polishing (CMP) is performed to remove excess gap fill 90, and the CMP stops at the hard mask 30 top surface due to differences in coefficient of friction between the hard mask and gap-fill. For example, the remaining portion of the hard mask 30 at this point can be greater than 150 nm in height.

Figure 11:
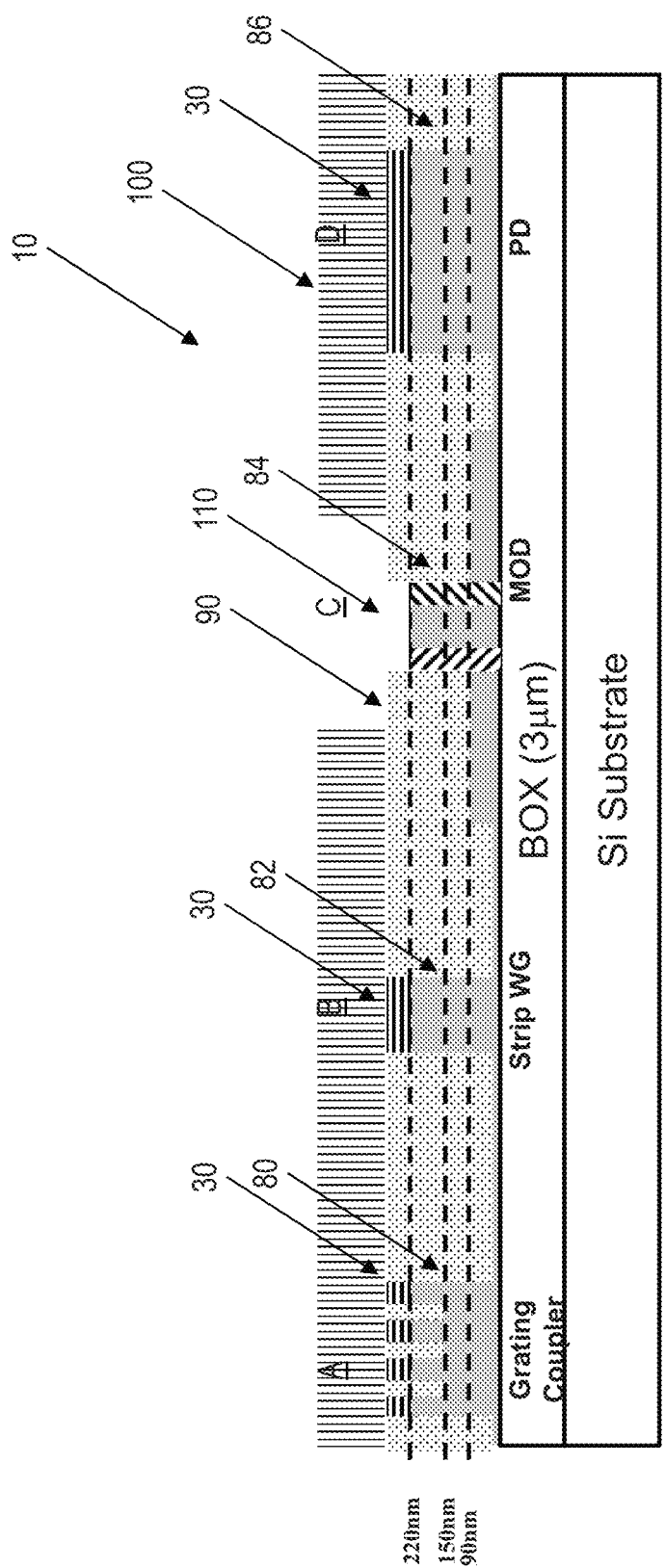

In FIG. 11, photo-lithography protection 100 is provided over the majority of the SOI wafer 10 except at the modulator 84. Again, the protection 100 can be a photoresist. The protection 100 is placed over the majority of the SOI wafer 10 except where it is desired to grow the region of customized thickness. Note, in FIG. 11, the photo-lithography protection 100 covers the vast majority of the regions A, B, D, and omits the region C. The photo-lithography protection 100 ends in the region C leaving some of the gap-fill 90 exposed. A key aspect is the photo-lithography protection 100 needs to cover the hard mask 30 portions in the other regions A, B, D but not cover the hard mask 30 portion in the region C, where the customized growth is desired.

Subsequent to the photo-lithography protection 100, the hard mask 30 is selectively removed at the modulator 84 in the region C, forming a cavity 110.

Figure 12:
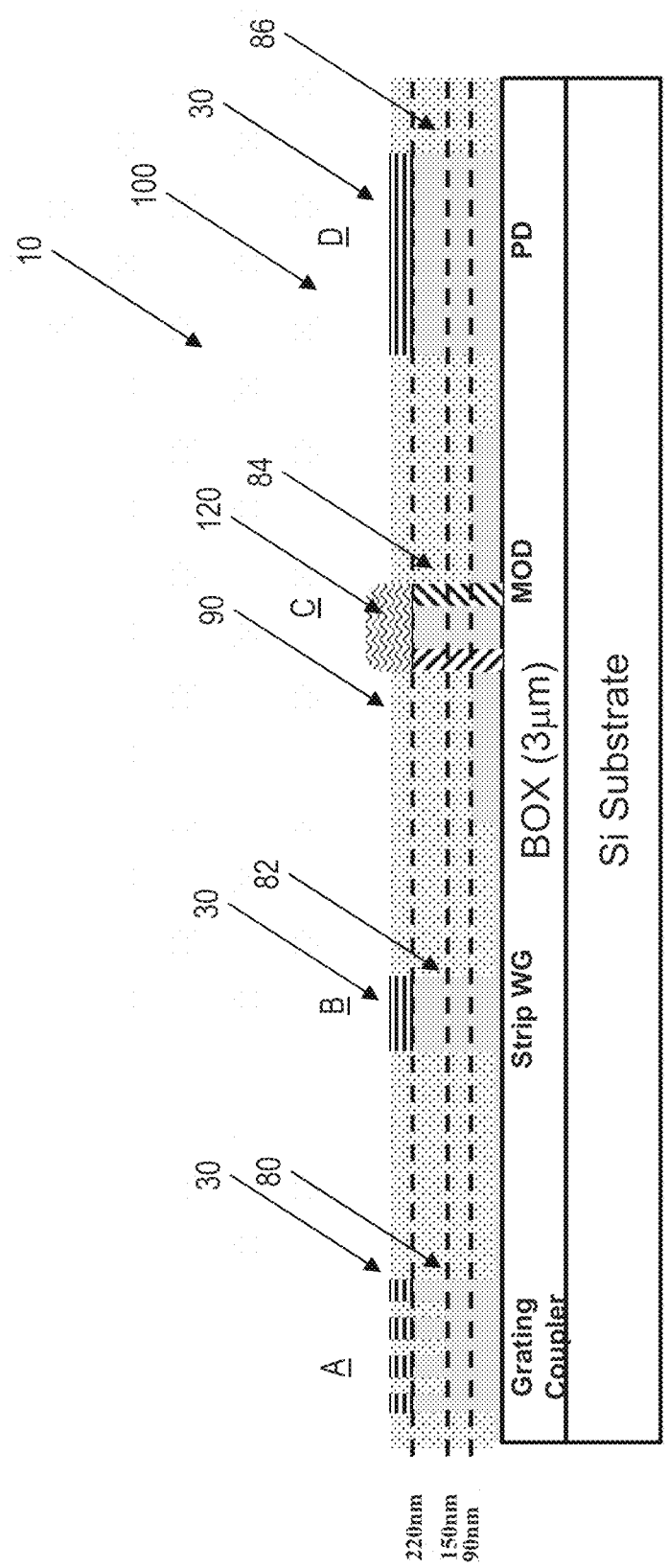

In FIG. 12, the cavity 110 is cleaned, and Si SEG is performed in the cavity 100. Prior to the epitaxy in the SEG, there can be a slight $SiO_2$ pull-back. During this procedure, a rib waveguide associated with the modulator 84 grows selectively in an auto-aligned feature. No subsequent material patterning steps are necessary. Advantageously, the required thickness is fully tunable and independent of the remaining platform. The sidewall roughness of the grown waveguide is the same as that of the underlying waveguide. Growth rate and uniformity can be controlled by adding relevant dummy structures all along the die. The dummy structures will also ensure better CMP uniformity due to a more uniformly distributed hard mask stop layer. After the SEG, the SOI wafer 10 includes an extension 120 of larger thickness in the region C than the remainder of the SOI wafer 10, namely the regions A, B, D.

Figure 13:
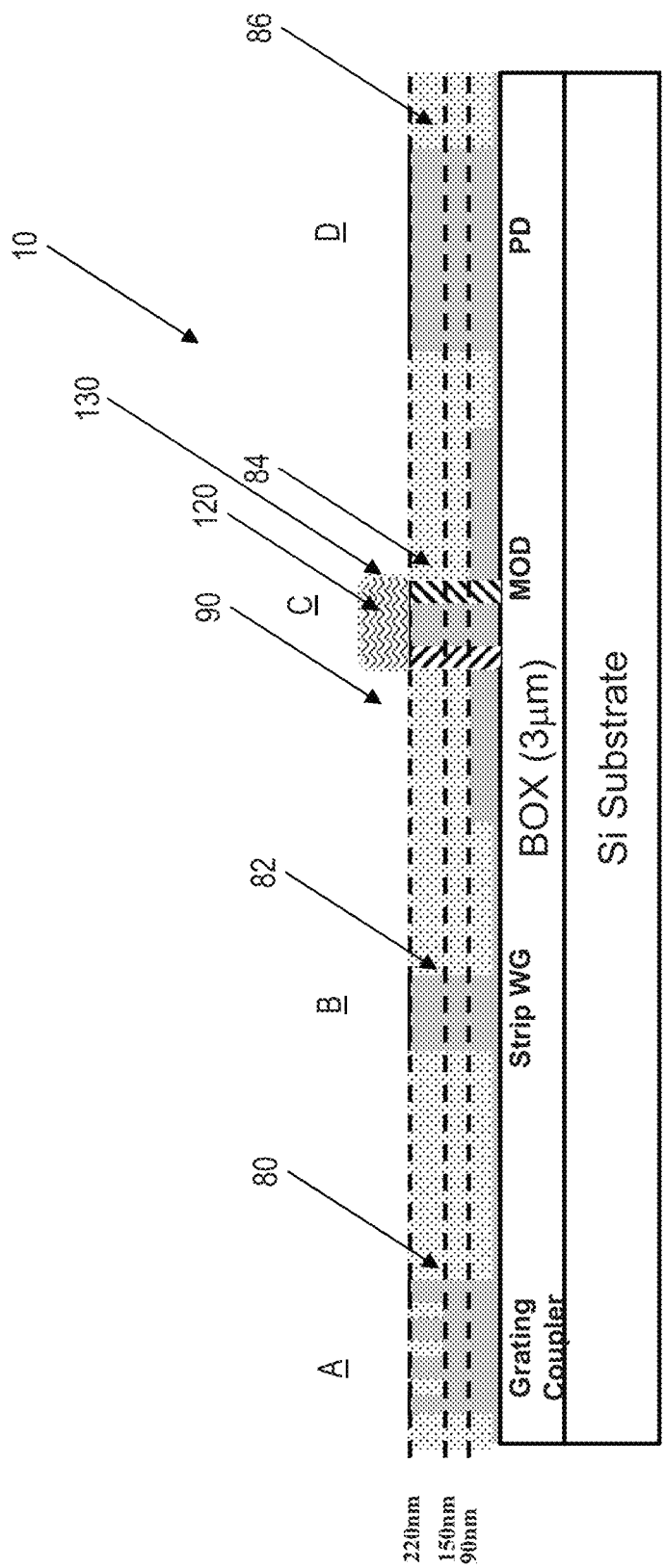

In FIG. 13, a SiO2 wet etching is performed and is time fixed to stop at 220 nm, i.e., the standard thickness of the SOI wafer 10. There is a hard mask wet etch (selective etch) to remove the hard mask 30. This step is used to remove the hard mask still present on the remaining optical structures. Wet etching (partial or total) of the SiO2 gap-fill is optional and depends on whether subsequent implantation steps are necessary or not. Subsequently, a Rapid Thermal Annealing (RTA) of the wafer under $O_2$ atmosphere will generate a thin protective layer of $SiO_2$ (line 130), such as a few nm, e.g., less than 7 nm, on top of the exposed Si. Such thermal oxide could be used as a protective layer during implantation. If not, an additional oxide deposition could be performed for this purpose.

Figure 14:
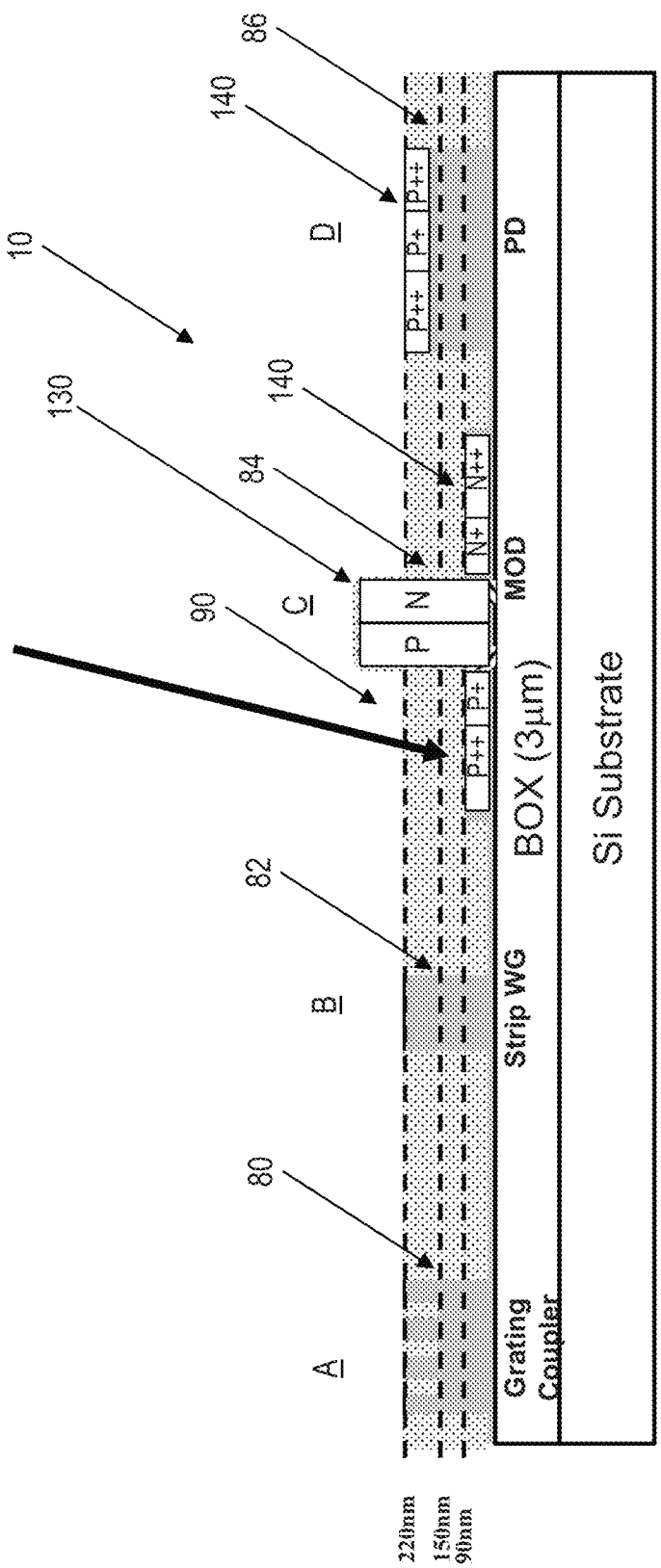

In FIG. 14, there is Si implantation (P++ and N++) 140 in the PN-junction for the modulator 84. There is also implantation 140 required for the photodetector 86.

Figure 15:
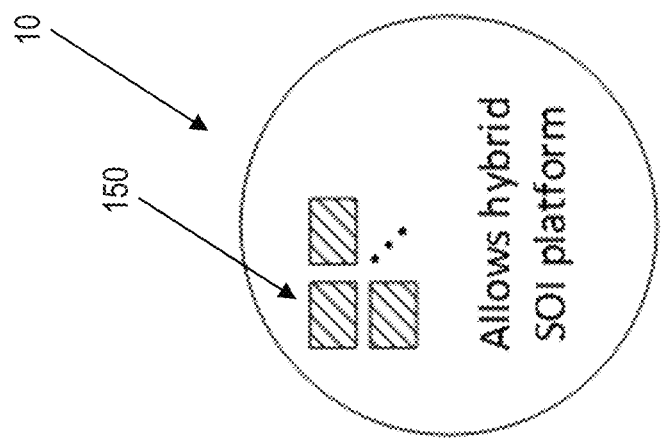
FIG. 15 is a top view diagram of an SOI wafer, before and after the Silicon Selective Epitaxial Growth (SEG) application to provide regions of customized thickness.

FIG. 15 is a top view diagram of an SOI wafer 10, before and after the SEG application to provide regions 150 of customized thickness. Again, in an embodiment, the SOI wafer 10 has a thickness of about 220 nm of the Si layer, whereas the regions 150 of customized thickness have a thickness of about 400 nm. Of course, other values are contemplated. As such, standard SiP processes can be used on the standard thickness.

Figure 16:
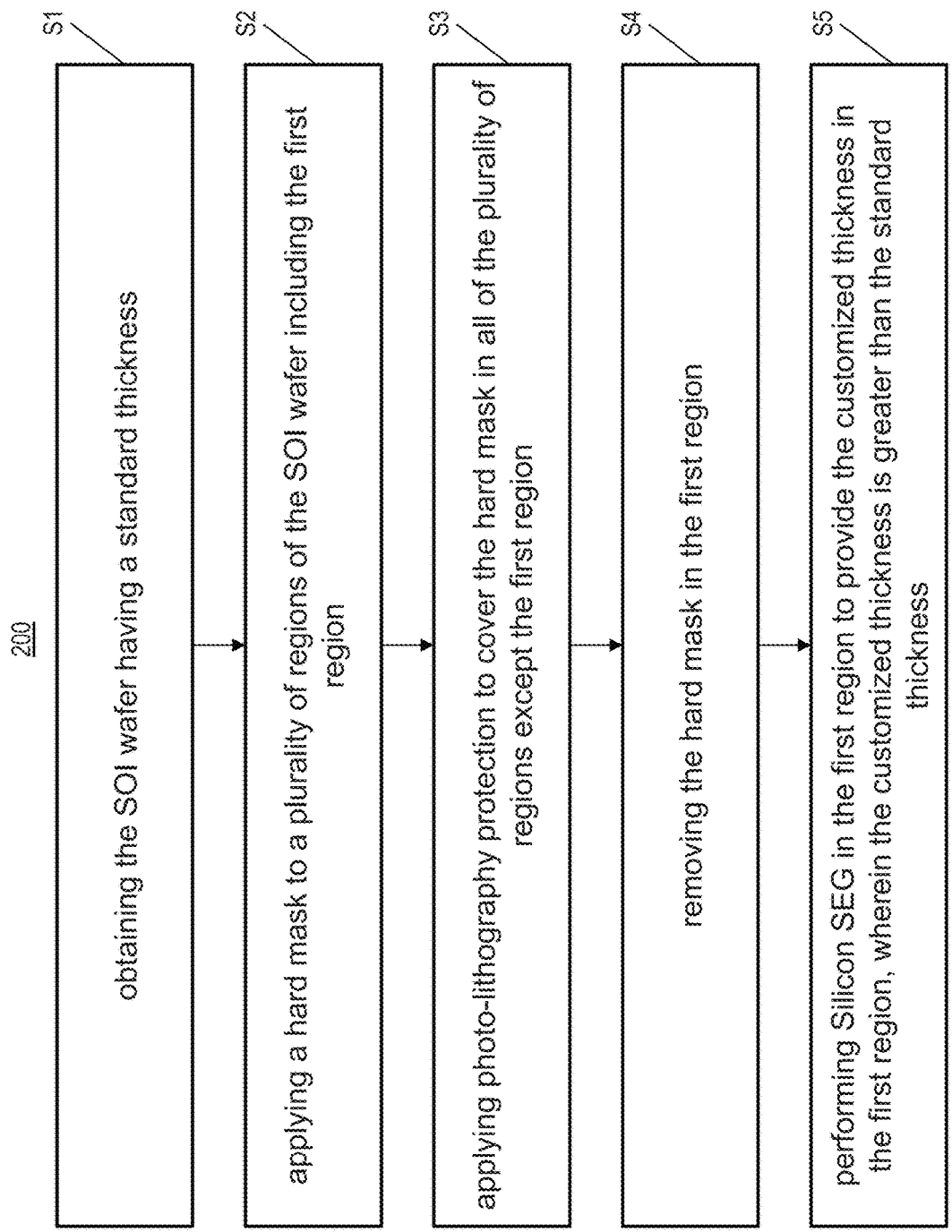
FIG. 16 is a flowchart of a process of SEG applied to an SOI wafer to provide a region of customized thickness.

FIG. 16 is a flowchart of a process 200 of Silicon Selective Epitaxial Growth (SEG) applied to a Silicon on Insulator (SOI) wafer to provide a region of customized thickness. The process 200 includes aspects described in FIGS. 1-14 relative to the fabrication process, specifically highlighting the critical steps involved with creating the region of customized thickness using Si SEG. The process 200 includes obtaining the SOI wafer having a standard thickness (step S1); applying a hard mask to a plurality of regions of the SOI wafer including the first region (step S2); applying photo-lithography protection to cover the hard mask in all of the plurality of regions except the first region (step S3); removing the hard mask in the first region (step S4); and performing Silicon SEG in the first region to provide the customized thickness in the first region, wherein the customized thickness is greater than the standard thickness (step S5).

The process 200 can further include performing implantation in the first region to form a PN junction. For example, the first region can include a modulator. For example, the first region can be the region C whereas the other regions are the regions A, B, D. Also, the performing implantation can be performed either before the applying hard mask or after the performing Silicon SEG.

The process 200 can further include performing patterning, photo-lithography protection, and/or etching in any of the plurality of regions excluding the first region, subsequent to the applying the hard mask. The process 200 can further include performing gap-fill deposition over the SOI wafer to fill in any etched regions, prior to the applying photo-lithography protection. A material for the gap-fill is different from a material for the hard mask. A material for the hard mask can include any of SiN, AlN, SiON, and TiN.

The hard mask can include a thickness similar to a thickness of a silicon upper layer of the SOI wafer. For example, the hard mask can have a thickness of about 200 nm where the SOI wafer has a thickness of about 220 nm of the Si layer. The hard mask can also be formed using multi-layer techniques.

In another embodiment, a Silicon on Insulator (SOI) wafer having a first region of customized thickness is formed by the process 200.

In a further embodiment, a modulator formed on a standard thickness Silicon on Insulator (SOI) wafer is formed by the process 200.

Again, the fabrication processes described herein were designed to accommodate a more efficient signal modulator in a silicon photonics platform without changing the whole platform (i.e., changing the thickness only of the modulator portion, not the entire SOI wafer). The modulator 84 can exploit the TM mode (vertical polarization) of a PN-junction so that the mode confinement is optimized while still preserving suitable electrical addressing. This PN-junction requires a customized SOI thickness. Locally, the SOI thickness must be changed only for the PN-junctions while remaining standard for the remaining devices. As mentioned, using a thicker SOI and etching down to standard thickness for the whole device library, except one, will introduce variability. Silicon photonics relies a lot on the availability of SOI wafer vendors. SOI wafer vendors are scarce (e.g., less than 5). Requesting custom SOI wafers such as locally thick SOI islands is not viable.

As such, the present disclosure provides a fabrication process using an SEG of silicon to have a localized thicker SOI only for the relevant device while not changing the other aspects of the platform.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method of Silicon Selective Epitaxial Growth (SEG) applied to a Silicon on Insulator (SOI) wafer to provide a first region of customized thickness, the method comprising:
   with the SOI wafer having a standard thickness, applying a hard mask to a plurality of regions of the SOI wafer including the first region, wherein the hard mask has a thickness similar to a thickness of a silicon upper layer of the SOI wafer;
   applying photo-lithography protection to cover the hard mask in all of the plurality of regions except the first region;
   removing the hard mask in the first region; and
   performing Silicon SEG in the first region to provide the customized thickness in the first region, wherein the customized thickness is greater than the standard thickness.

2. The method of claim 1, further comprising
   performing implantation in the first region to form a PN junction.

3. The method of claim 2, wherein the first region includes a modulator.

4. The method of claim 2, wherein the performing implantation is performed either before applying the hard mask or after the performing Silicon SEG.

5. The method of claim 1, further comprising
   performing patterning, photo-lithography protection, and/or etching in any of the plurality of regions excluding the first region, subsequent to the applying the hard mask.

6. The method of claim 5, further comprising
   performing gap-fill deposition over the SOI wafer to fill in any etched regions, prior to the applying photo-lithography protection.

7. The method of claim 6, wherein a material for the gap-fill is different from a material for the hard mask.

8. The method of claim 1, wherein a material for the hard mask includes any of SiN, AlN, SiON, and TiN.

9. A Silicon on Insulator (SOI) wafer having a first region of customized thickness, the SOI wafer is formed by a process comprising the steps of:
   with the SOI wafer having a standard thickness, applying a hard mask to a plurality of regions of the SOI wafer including the first region, wherein the hard mask has a thickness similar to a thickness of a silicon upper layer of the SOI wafer;
   applying photo-lithography protection to cover the hard mask in all of the plurality of regions except the first region;
   removing the hard mask in the first region; and
   performing Silicon SEG in the first region to provide the customized thickness in the first region, wherein the customized thickness is greater than the standard thickness.

10. The SOI wafer of claim 9, the process further comprising the steps of
    performing implantation in the first region to form a PN junction.

11. The SOI wafer of claim 10, wherein the first region includes a modulator.

12. The SOI wafer of claim 10, wherein the performing implantation is performed either before the applying the hard mask or after the performing Silicon SEG.

13. The SOI wafer of claim 9, the process further comprising the steps of
    performing patterning, photo-lithography protection, and/or etching in any of the plurality of regions excluding the first region, subsequent to the applying the hard mask.

14. The SOI wafer of claim 13, the process further comprising the steps of
    performing gap-fill deposition over the SOI wafer to fill in any etched regions, prior to the applying photo-lithography protection.

15. The SOI wafer of claim 13, wherein a material for the gap-fill is different from a material for the hard mask.

16. The SOI wafer of claim 9, wherein a material for the hard mask includes any of SiN, AlN, SiON, and TiN.

17. A modulator formed on a standard thickness Silicon on Insulator (SOI) wafer formed by a process comprising the steps of:
- with the SOI wafer having a standard thickness, applying a hard mask to a plurality of regions of the SOI wafer including a first region where the modulator will be located, wherein the hard mask has a thickness similar to a thickness of a silicon upper layer of the SOI wafer;
- applying photo-lithography protection to cover the hard mask in all of the plurality of regions except the first region;
- removing the hard mask in the first region;
- performing Silicon SEG in the first region to provide the customized thickness in the first region, wherein the customized thickness is greater than the standard thickness; and
- performing implantation in the first region to form a PN junction.

18. The modulator of claim 17, the process further comprising the steps of
- performing patterning, photo-lithography protection, and/or etching in any of the plurality of regions excluding the first region, subsequent to the applying the hard mask.

\* \* \* \* \*